United States Patent [19]

Longshore

[11] 4,286,277
[45] Aug. 25, 1981

[54] PLANAR INDIUM ANTIMONIDE DIODE ARRAY AND METHOD OF MANUFACTURE

[75] Inventor: Randolph E. Longshore, Alexandria, Va.

[73] Assignee: The United States of America as represented by the Secretary of the Army, Washington, D.C.

[21] Appl. No.: 854,435

[22] Filed: Nov. 22, 1977

[51] Int. Cl.³ .............................................. H01L 27/14
[52] U.S. Cl. ....................................... 357/30; 357/61; 357/71
[58] Field of Search .............................. 357/30, 61, 71

[56] References Cited

U.S. PATENT DOCUMENTS

| | | | |
|---|---|---|---|
| 3,231,421 | 1/1966 | Schmidt | 117/212 |
| 3,465,211 | 9/1969 | Adams | 317/234 |
| 3,554,818 | 1/1971 | Lambert | 148/186 |
| 3,882,531 | 5/1975 | Michon | 357/24 |

Primary Examiner—Martin H. Edlow
Attorney, Agent, or Firm—Nathan Edelberg; Milton W. Lee; John E. Holford

[57] ABSTRACT

An improved diode array and method of manufacture is provided by the diffusion of cadmium from an indium-cadmium alloy through a silicon diode mask into bulk indium-antimonide to form a planar structure.

6 Claims, 8 Drawing Figures

```
DEPOSITION OF DIFFUSION MASK
            │ STEP (1)
            ▼
   CLEAN DEPOSITION CHAMBER
            │ (2)
            ▼
           DRY
            │ (3)
            ▼
   RECLEAN WAFER (OPTIONAL)
            │ (4)
            ▼
         MOUNT WAFER
             IN
      DEPOSITION CHAMBER
            │ (5)
            ▼
    PURGE CHAMBER WITH N₂
            │ (6)
            ▼
        HEAT WAFER
            │ (7)
            ▼
    ADMIT SiH₄, O₂ & N₂
            │ (8)
            ▼
     CUTOFF DEPOSITION
            │ (9)
            ▼
        COOL WAFER
            │ (10)
            ▼
       REMOVE WAFER
           FROM
     DEPOSITION CHAMBER
            │ (11)
            ▼
       BOND WAFER
            TO
         SPINNER
            │ (12)
            ▼
     APPLY PHOTORESIST
            │
            ▼ STEP (13)
       UNBOND WAFER
            │ (14)
            ▼
     PLACE MASK ON WAFER
            │ (15)
            ▼
     EXPOSE PHOTORESIST
            │ (16)
            ▼
        REMOVE MASK
            │ (17)
            ▼
     DEVELOP PHOTORESIST
            │ (18)
            ▼
    REPEAT STEPS 4-6, 9 & 10
            │ (19)
            ▼
      STRIP PHOTORESIST
            │ (20)
            ▼
          RINSE
            │ (21)
            ▼
           DRY
            │ (22)
            ▼
    REPEAT STEPS 4-6, 9 & 10
```

FIG. 4

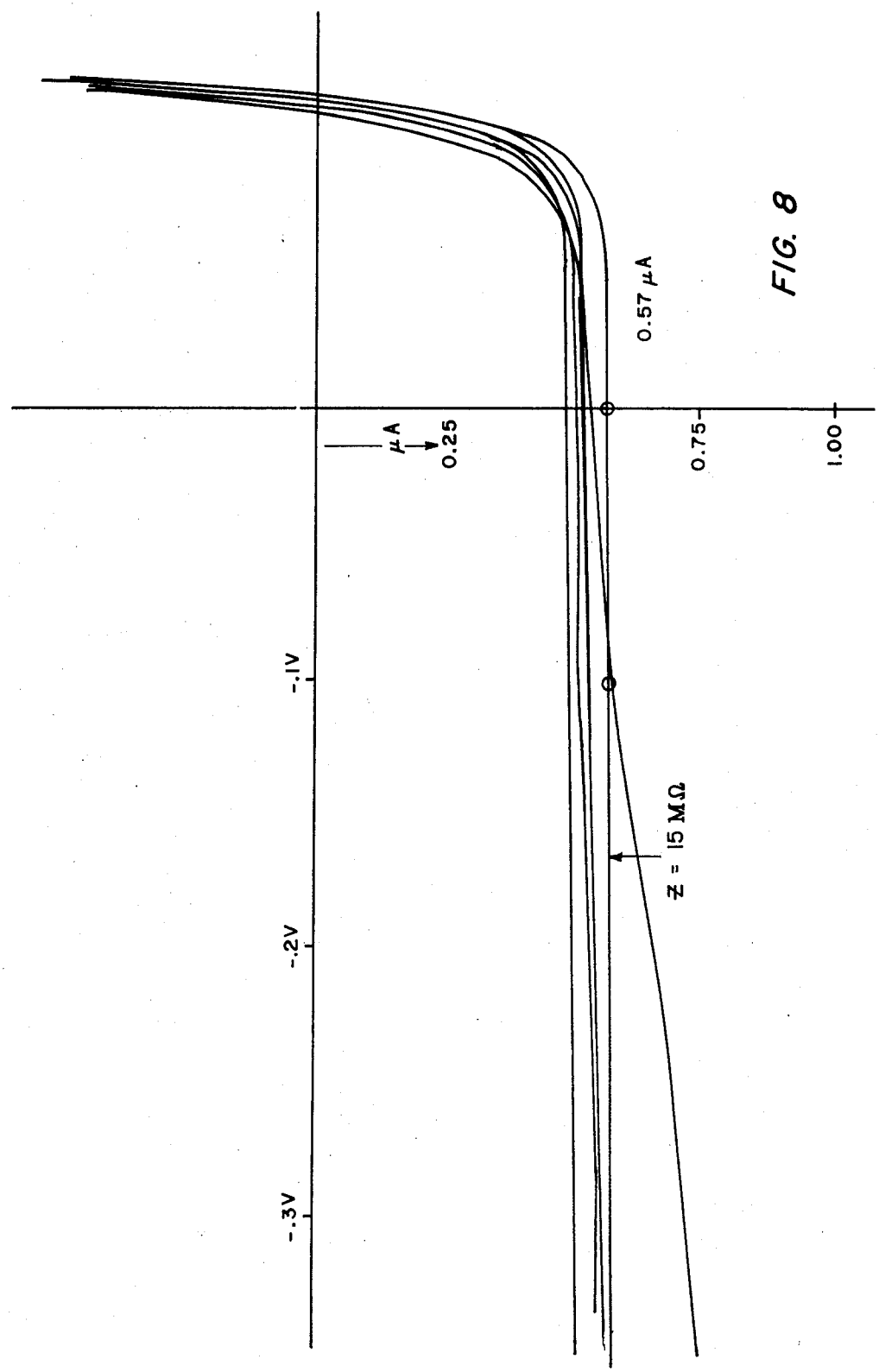

PLANAR INDIUM ANTIMONIDE DIODE ARRAY AND METHOD OF MANUFACTURE

The invention described herein may be manufactured, used, and licensed by the U.S. Government for governmental purposes without the payment of any royalties thereon.

BACKGROUND OF THE INVENTION

Indium-antimonide (InSb) has been found to be a particularly useful semiconductor material for making photovoltaic detectors in the 3–5 micrometer wavelength portion of the infrared spectrum. The structure usually consists of an n-type material doped with tellurim onto which is diffused cadmium or zinc to form a p-type layer. Due to the difficulty in masking this diffusion the p-type material has been applied to the entire surface of the n-type material and then the portions between diodes are etched away to produce individual mesas. These mesas become troublesome during the subsequent steps of surface passivation and electrode formation due to the difficulty in controlling the film thickness at the edges of the mesa. This process also produces a certain amount of contamination of the n-type material between the diodes which can lend to poor yields or undesireably large spacing of the diodes.

BRIEF DESCRIPTION OF THE INVENTION

It is an object of the present invention to get around these difficulties by diffusing the p-type material into the surface of n-type material through a silicon dioxide mask thereby producing planar semiconductor structure. The silicon dioxide mask is removed from this structure which is then provided with surface passivation and electrode lead out structures.

BRIEF DESCRIPTION OF THE DRAWINGS

The invention is best understood with reference to the accompanying drawings wherein:

FIG. 4 is a flow chart showing the steps involved in forming the SiO$_2$ mask;

FIG. 8 is current vs. voltage plot of a number of diodes manufactured according to the present invention.

DESCRIPTION OF THE PREFERRED EMBODIMENT

Figure 1:
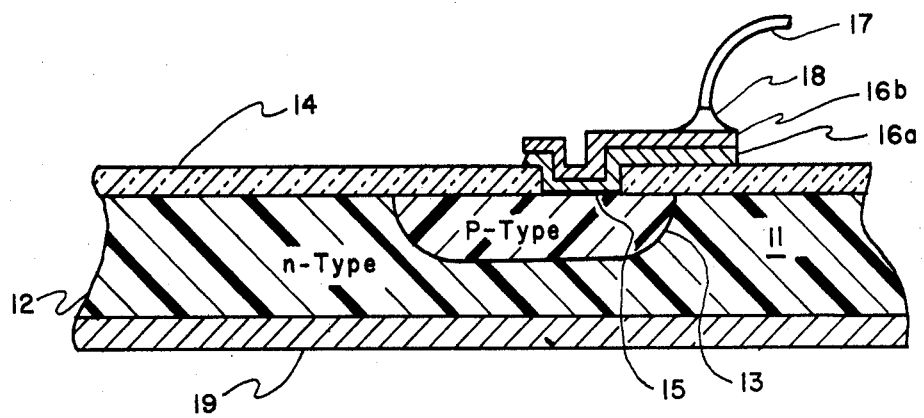
FIG. 1 is a cross-sectional view of one diode element made in accordance with the present invention.

Referring specifically to FIG. 1 there is shown a cross section of one diode 11 in a large array that may contain hundreds of diodes. The diodes share a base consisting of a wafer 12 of n-type InSb having substantially parallel broad surfaces. Each diode includes a separate region or pocket 13 of p-type material diffused into the wafer and having a well defined preferably rectangular contact surface coplanar with one of the above broad surfaces. Usually the diodes will be coplanar with the same surface and that surface will be flat. The diodes are spaced as closely as possible, i.e. so that a minimum leakage of charge carriers is maintained between the pockets and their electrodes (to be described). A passivating layer 14 covers said one broad surface, the coating preferably being chemically inert, impervious to atmospheric gases and vapors, structurally sound and transparent to light of wavelengths in the 3–5 micrometer region. A coplanar opening or window is defined on the wafer surface by the layer 14 over each pocket the window having an area which is only a small percentage of the contact surface, e.g. about one mil square on a pocket several mils square. An electrode, consisting of a base layer 15 and two elements 16A and 16B, overlaps the window and the passivating layer 14 to provide a broad external contact surface and an intimate internal surface in contact with the coplanar surface of the pocket but well spaced from the junction of the n and p-type materials. The material 15 is chosen to be chemically inert and a good conductor. The material 16A is chosen less for its electrical conductivity than its adhesive qualities and high melting point relative to the adjacent materials in the diode. The material 16B is chosen for its high conductivity and low melting point. The preferred materials for elements 14–16B are SiO, a noble such as palladium or platinum, chromium and gold, respectively. Gold leads 17 are placed on each electrode and permanently connected with a fillet 18 of their common material formed by the application of nest and/or pressure.

Figure 2:
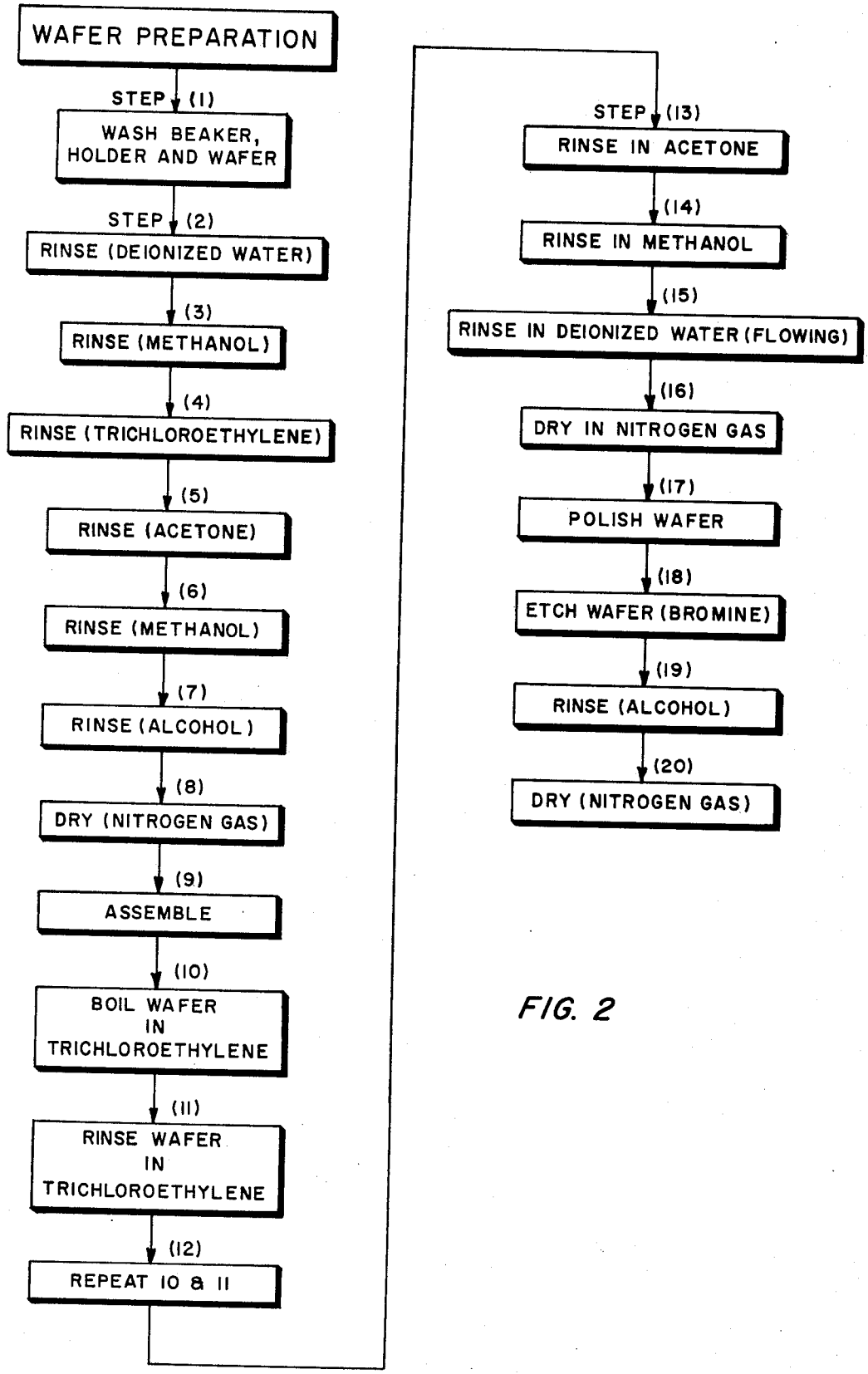
FIG. 2 is a flow chart of the surface preparation steps performed on the n-type InSb wafer which precedes the application of a silicon dioxide mask.

To make the above array, the wafer of InSb is first prepared as indicated in FIG. 2. As previously indicated this material has previously been doped with Te to obtain a carrier concentration of $2 \times 10^{15}$ cm$^{-3}$ and a mobility between $(1.5$ and $2) \times 10^5$ cm$^2$V sec$^{-1}$. The wafer is 36 mils thick, $\frac{3}{4}$ to 1 inch in diameter and has its broad faces within one degree of being parallel to the (111) planes of its lattice structure. The preparation includes the following steps:

1. The preparation breaker, wafer holder and the wafer are washed in a low sudsing laundry detergent (the holder being any frame-like inert structure for firmly holding and manipulating the wafer by touching it only near its edges);
2. The wafer is then first rinsed in hot (80°–90° C.) deionized water;
3. This is followed by a second rinse in methanol;
4. Then a third rinse in tricholorethylene;
5. A fourth rinse in acetone;
6. A fifth rinse again with methanol;
7. And finally a sixth rinse in flowing deionized water
8. The three elements are then dried with a blast of nitrogen gas;
9. The wafer is next placed in the holder and both placed in the beaker;
10. Trichlorethylene is added to the beaker and heated to its boiling point;
11. After a few minutes of boiling, the boiling trichlorethylene is poured off and a fresh warm quantity added as a rinse and also poured off;
12. Steps 10 and 11 are then repeated;
13. Acetone is next added and poured off;
14. Step 13 is then repeated using methanol instead of acetone;
15. Step 13 is again performed using deionized water;

16. The wafer is finally removed from the beaker and holder and dried in a blast of nitrogen gas without touching its broad surfaces;

17. The wafer is next mounted on a pyrex lapping plug using wax as an adhesive and inserted into a glass lapping fixture. The wafer is then polished with a pellon pad (PAN-W) saturated with 2% solution of bromine in ethanol or isopropyl alcohol. When isopropyl is used it must be cold (0° C.) and mixed slowly. The polishing continues for five minutes or until surface has a perfectly smooth appearance. The wafer is then quenched in methanol or isopropyl alcohol to stop the etching.

18. At this point the wafer is free etched in a fresh solution of 2% bromine in methanol or isopropyl alcohol for 1 minute.

19. The etching is followed by a rinse in isopropyl alcohol;

20. Finally surface preparation is completed by drying the wafer again in a blast of nitrogen gas.

Figure 3:
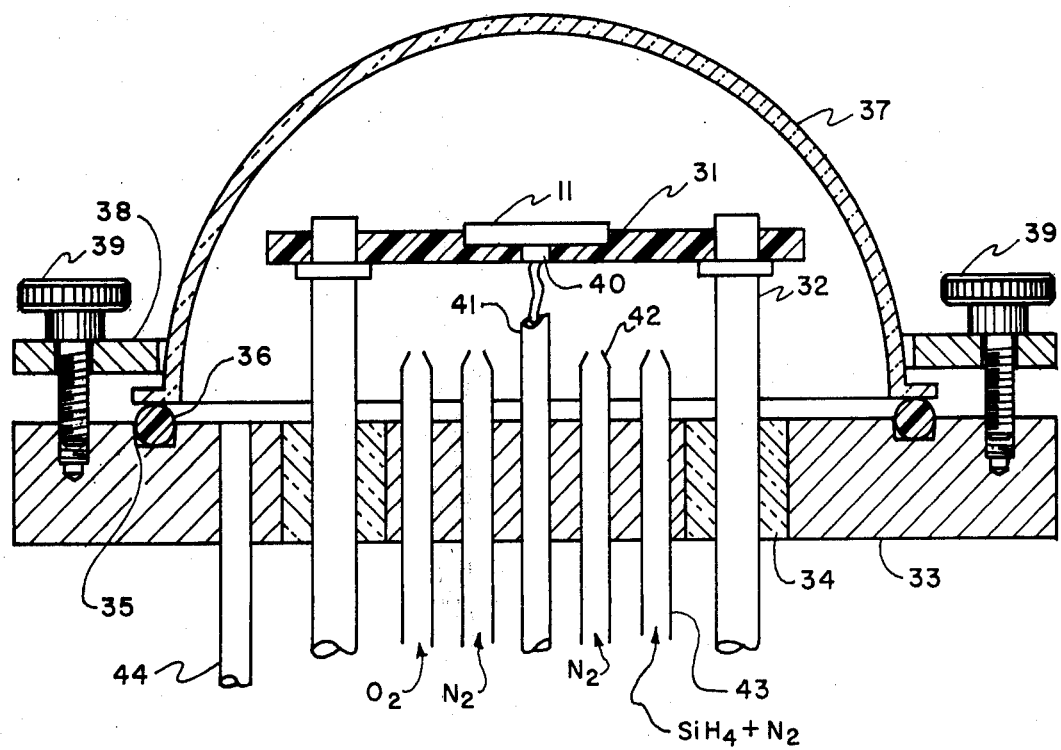
FIG. 3 is a cross-sectional view of the vacuum chamber (VC) used to deposit the SiO$_2$ mask.

FIG. 3 shows a special deposition chamber (DC) used in preparing a silicon dioxide mask for the wafer. The wafer 11 is supported in the chamber on a carbon heating block 31 which can be heated by an electric current therethrough to temperatures in excess of 500° C. Such a current is supplied through electrodes 32 which extend through the heavy base 33 of the chamber sealed and are insulated with respect thereto by pressure sealed dielectric bushings 34. The base is shaped to define a circular groove 35 into which is placed an o-ring 36. A circular glass dome 37 covers the carbon block and engages the o-ring to seal off the chamber. A clamping ring 38 attached to the base by thumb screws 39 holds the dome in place. A thermocouple 40 is mounted in the center of the carbon block. A cable 41 sealed through the base carries the thermocouple leads out to an external meter (not shown). A plurality of tubes like 42 and 43 sealed through the base are distributed over the floor of the chamber to introduce various processing gases. An additional plurality of tubes 44 are provided to exhaust unwanted gases from the chamber.

Figure 5:
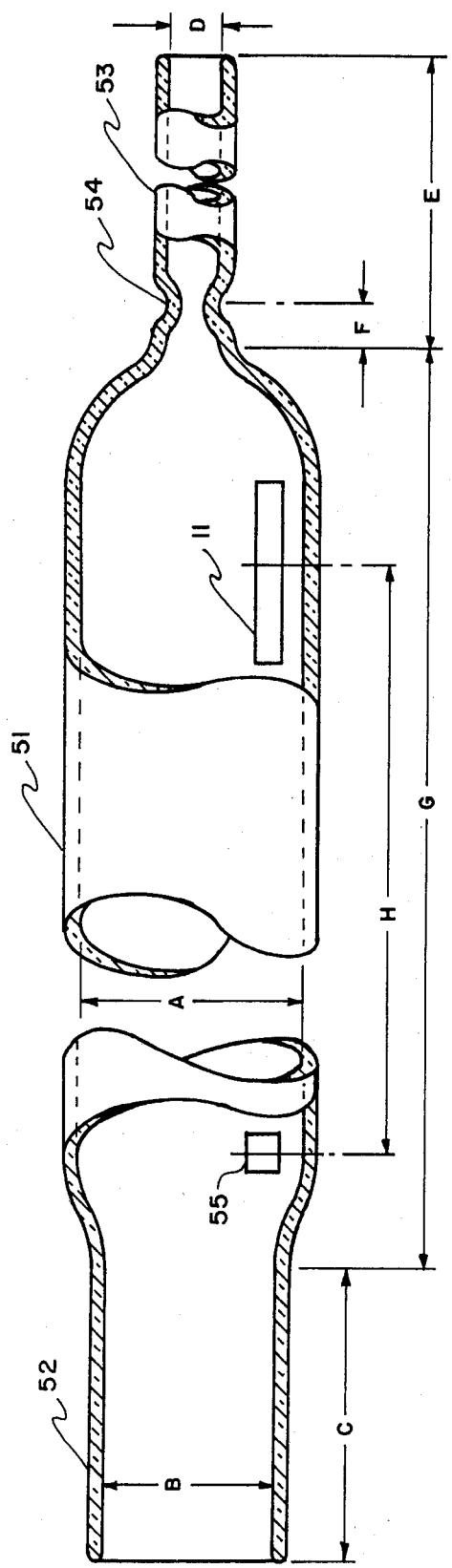
FIG. 5 is a cross-section of the ampoule used in diffusing the p-type regions of the wafer.

As indicated in FIG. 4 the deposition of the silicon dioxide mask involves the following steps:

1. The deposition chamber is first cleaned using the same procedure given in steps 1–9 for the wafer, etc. The carbon block is cleaned separately by soaking it in hydroflouric acid;

2. The block is then placed in the chamber with flowing nitrogen gas and dried at 450° C.;

3. If the wafer has been handled or poorly stored for a sufficient period of time the cleaning steps 1–9 in FIG. 2 should be repeated, but normally no further preparation is required;

4. The clean wafer is inserted directly into the carbon block;

5. The chamber is subsequently purged with nitrogen gas including all gas lines and exhaust lines leading to or from the chamber;

6. The carbon block is then heated to between 370° and 400° C.;

7. Once the system is completely purged oxygen ($O_2$) and silane ($SiH_4$) are introduced on a mole for mole basis along with the nitrogen to produce a silicon dioxide layer on the heated wafer surface, the flow rates used were 60 cc/min for silane, 60–90 cc/min for oxygen and 2000 cc/min for the nitrogen;

8. As the $SiO_2$ layer grows it changes color and this can be observed through the glass dome of the chamber, after the layer has proceded from tan to purple to blue to yellow to rose to purple to blue the reaction is halted by reducing the current supplied to the carbon block, shutting off the silane supply and then stopping the oxygen;

9. The final layer will have a blue-green color and should be about 3000 Å thick, thicker films produce stains in the wafer and thinner films fail to mask out the diffusion materials, the flow of nitrogen is maintained only until the wafer approaches room temperature;

10. The room temperature wafer is now removed from the deposition chamber;

11. The wafer is next placed on a spinner or rotating platform which spins wafer about its center axis at 5000 rpm;

12. The layer of photoresist is applied by pouring the photoresist onto the center of the wafer, a product known as Shipley 135 serves quite well;

13. After spinning 20 minutes at 80° C. the wafer is removed from the spinner;

14. A glass mask defining the p-type regions or pockets is attached to the wafer;

15. The wafer with mask is then exposed to ultraviolet light to expose the photoresist;

16. The mask is next removed from the wafer;

17. The photoresist is now developed without removing the photoresist from the pocket regions;

18. Steps 4–6, 9 and 10 are now repeated except that the wafer is heated only to 105° C. for a total time of 30 minutes;

19. The silicon diode is next removed from the pocket regions by soaking the wafer is a buffered hydroflouric acid solution consisting of 200 gm. of $NH_4F$, 70 ml. of HF and 500 ml. of water for two minutes, the solution is then renewed and the wafer soaked for an additional 2 minutes;

20. The diode is then rinsed in deionized water to remove any remaining acid and loose particles of silicon diode;

21. Any remaining water is then removed with a blast of nigrogen gas;

22. Steps 4–6, 9 and 10 are then repeated except that temperature is maintained between 310°–350° C. for 15 minutes;

FIG. 5 shows ampoule 51 used to diffuse the p-type material into the n-type base. The ampoule is made from commercially available pyrex glass. The central portion has an inside diameter A of 4 cm. A tubular mouth portion 52 having an inside diameter B of 3 cm and a length C of 5 cm is formed on one end by tapering the last couple of centrimeters of the central portion. An exhaust tube 53 with an inside diameter D of 0.9 cm and a length E of 16 cm is formed in a similar fashion on the opposite end. This tube has a partial pinch off 54 a distance F of about 1 cm from the central portion. The cental portion has a length G of 22 cm about 18 cm of which has a uniform diameter. The wafer 11 is placed through the mouth portion and pushed to the opposite end of the central portion. A diffusion source is also placed through the mouth portion, but is placed near the mouth portion in the central portion. The center of the source and the wafer are spaced apart a distance H equal to 10 cm. Before placing either, however, the ampoule must be thoroughly cleaned as a part of the diffusing process.

Figure 6:
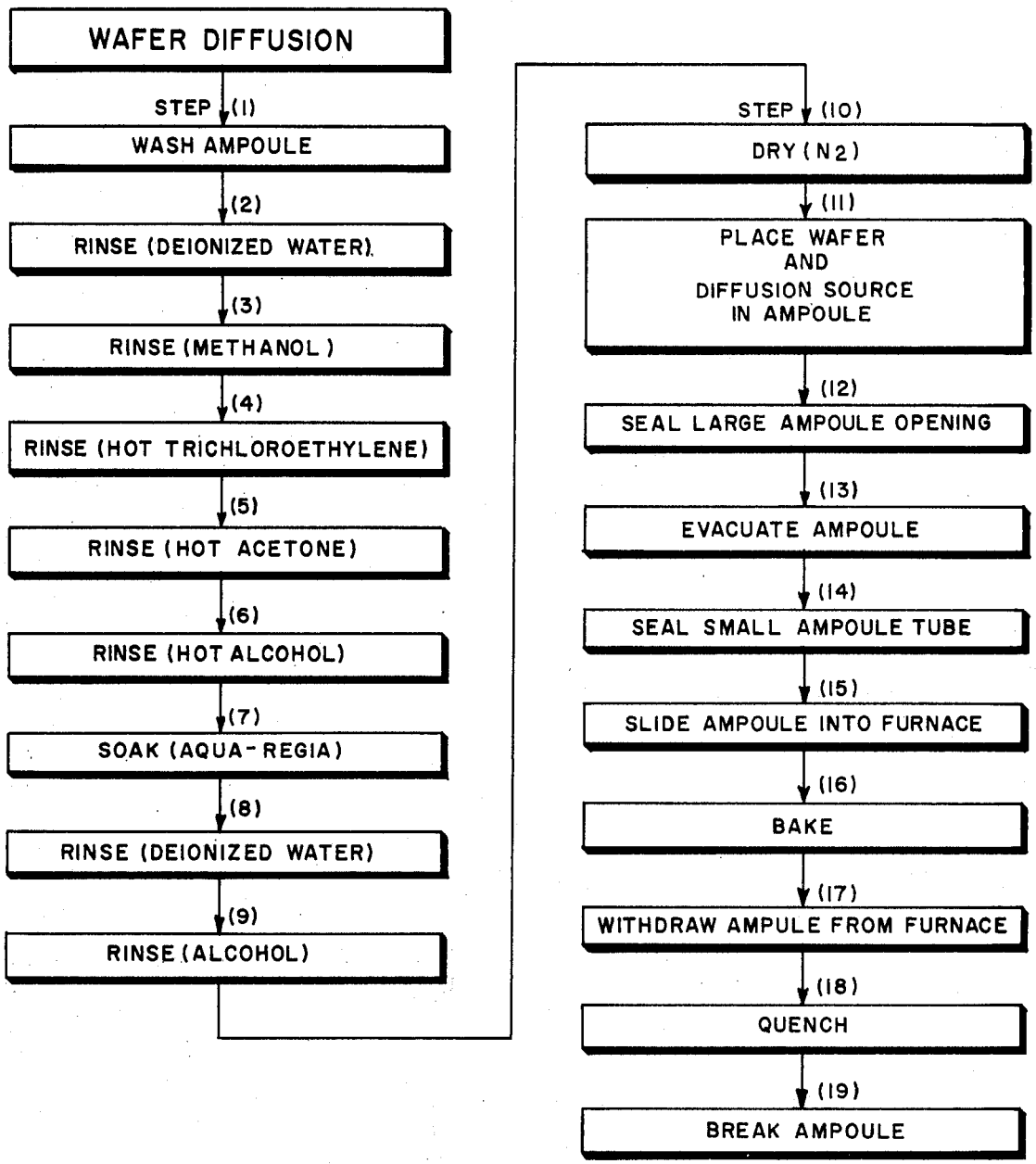
FIG. 6 is a flow chart showing the steps involved in forming the p-type regions.

FIG. 6 shows a flow diagram of the steps involved in diffusing the p-type material into the wafer, which are:

1. The ampoule is washed with a low sudsing detergent;

2. This is followed by a first rinse in deionized water;
3. A second rinse in methanol;
4. A third rinse is hot trichloroethylene;
5. A forth rinse in hot acetone;
6. A fifth rinse in hot (the term "hot" as used herein implies just below boiling of the material involved) alcohol (isopropyl-dry);
7. Then followed by a thirty minute soak in aqua regia;
8. Another rinse in deionized water; and
9. A final rinse in alcohol (isopropyl-dry);
10. The ampoule is then dried with a blast of nitrogen gas;
11. The wafer and diffusion source are now installed in the ampoule as previously indicated, the diffusion source consisting of 80 to 100 mg slug of an alloy of 10% cadmium in indium plus a small amount of antimony shot, all of which are 99.9999% pure;
12. The mouth of the ampoule is next sealed by heating it to its softening point and compressing it with a metal clamp;
13. The exhaust tube is then connected to a vacuum system and pumped to a vacuum of $10^{-6}$ torr;
14. While the vacuum is maintained the pinch-off is heated until the tube is sealed by external atmosphere pressure;
15. The ampoule is then disconnected from the vacuum system, placed on a stainless steel cradle (not shown) and pushed slowly and steadily into a furnace along a track having a minimum positive temperature gradient of 0.4°-0.5° C./cm and a temperature peak of between 400° and 450° C. near the center of the furnace, the wafer end of the ampoule is introduced first about 25 centimeters from the furnace center and takes 30 minutes to reach the center, so that the wafer does not suffer themal shock damage and is always 4°-5° C. hotter than the source;
16. The wafer is held at the center of the furnace for 6-9 hours, to provide a diffusion depth of 3-5 microns;
17. The ampoule is then withdrawn source-end first at the same speed at which it entered;
18. As the source emerges from the furnace that end of the ampoule is quenched by clamping with metal pliers to condense excess cadmium and antimony vapor there rather than on the wafer;
19. After cooling the ampoule is scribed with a glass cutter and broken to obtain the wafer which is now ready to be processed into a detector array or arrays.

Figure 7:
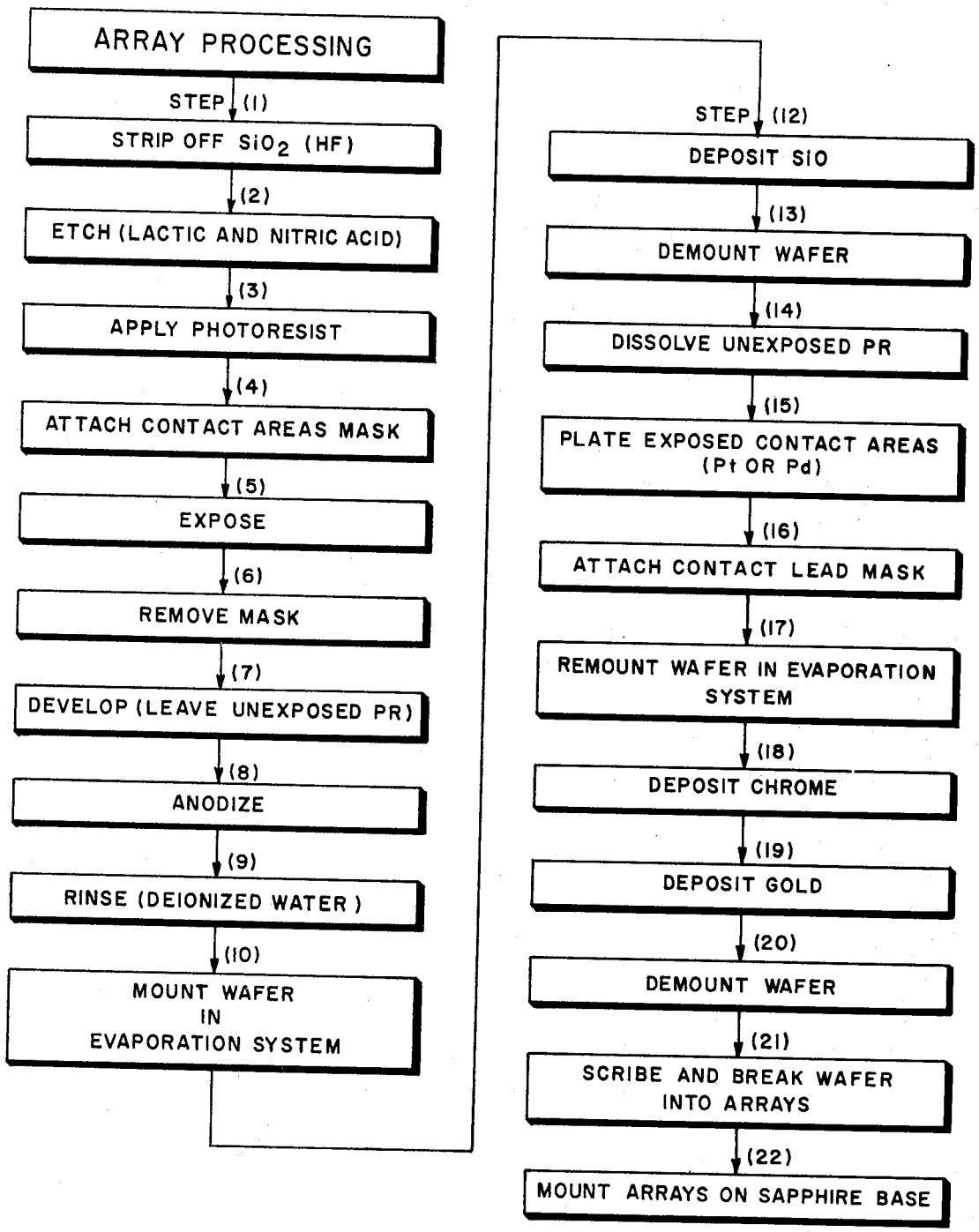
FIG. 7 is a flow chart showing the remaining steps necessary to complete a diode array for use as a photodetector.

FIG. 7 is a flow diagram of the processing which yields the final array structures and involves the following steps:

1. The silicon dioxide mask is first removed by etching in the above mentioned solution of hydrofluoric acid for 3 minutes;
2. The wafer is then etched with a solution of 10 parts of lactic acid and one part of nitric acid, for about one minute, i.e. approximately one micron per minute. Several small equal portions removed from the chip should be etched for different times and tested for quantrum efficiency before committing the remaining wafer to the etching bath);
3. A thick layer of positive photoresist is then applied to the diffused surface of the wafer in the manner of steps 11-13 of FIG. 4;
4. A second optical mask defining window areas within the diffused pocket regions is next attached to the wafer;
5. The photoresist is then exposed to ultraviolet light;
6. The second mask can now be removed;
7. The photoresist is developed leaving plugs of this material on the window areas;
8. The wafer is next anodized in a 0.1 normal solution of KOH or $NH_4OH$, the applied voltage is 18 volts with the current limited by a 2000 ohm resistor, the process is halted when the n-type material begins to turn green-gold and the p-type material turns purple;
9. The wafer is then rinsed in warm (80°-90° C.) deionized water;
10. Next the wafer is mounted in the vacuum chamber of a standard metal evaporation system (ES) which is pumped to a vacuum of $10^{-6}$ torr;
11. A $\lambda/4$ coating (approx. 1 micron) layer of silicon monixide is evaporated over the diffused surface of the wafer from a commercially available pure source using an electrically heated tungsten boat, to form an insulating, protective and anti-reflective coating;
12. The wafer is now removed from the chamber;
13. The remaining photoresist is then dissolved away from acetone which easily passes through the poorly formed pourous silicon monoxide covering it, the latter being easily removed by a subsequent flush with deionized water exposing the surface of the pockets within the window areas;
14. After the flush, the wafer is placed in an electroplating bath and the exposed pocket surface is coated with a base layer either platinum or palladium to a thickness of about 100 Å;
15. After plating a third thin metal mask containing apertures to define a contact area for each diode is mounted on the wafer, this area overlaps the contact windows and the silicon monoxide to provide a sufficiently large area for lead soldering;
16. The wafer is then remounted in the evaporation system, which is again pumped to a vacuum of $10^{-6}$ torr;
17. A first contact layer of chrome 100-200 Å thick is first deposited through the third mask;
18. A second layer of gold is then deposited over the chrome for a thickness of about 2000-3000 Å;
19. The completed diodes can now be demounted from the ES, assuming a perfect yield a very large scale array would exist at this point;
20. If a perfect yield is not expected or needed the wafer can be scribed and broken into smaller arrays;
21. It is convenient in many cases to indium solder these chips on sapphire bases which provide added strength, electrical insulation and excellent thermal conduction.

The common return conductor for the diodes can be formed on any portion of the n-type material at the same time and in the same manner as the contacts for the p-type areas, or it can be applied as a protective coating on the back of the wafer (or chip). The soaking or rinsing steps above can be accompanied with agitation to improve their efficiency.

FIG. 8 shows a plot of current vs. bias voltage for an array of diodes fabricated by the method discussed above. Note the uniform impedance (15 megohms) and the uniform and well formed knee in their characteristic curves.

Many variations of the above mentioned methods and resulting products will be immediately apparent to those skilled in the art, but the present invention is limited by only the claims which follow.

I claim:
1. A photodiode comprising:

a wafer of n-type indium antimonide doped with telluride having a carrier concentration of $2 \times 10^{15}$ and a mobility between 1.5 and 2 times $10^5$; said wafer having a planar surface;

isolated pockets of p-type material imbedded in said wafer having exposed contact surface areas coplanar with said planar surface;

a layer of silicon oxide covering said planar surface and contact surface except for a small percentage of said contact surface; and a separate electrode at each pocket covering and contacting said small percentage of contact surface and at least a continuous narrow strip of said silicon oxide surrounding said small percentage of contact surface, wherein each electrode comprises: a thin layer of a noble metal covering only said small percentage of contact surface area, a layer of chromium covering said noble metal and some of the surrounding silicon oxide, and a layer of gold covering said chromium.

2. A photodiode according to claim 1 wherein:
said noble metal is palladium.

3. A photodiode according to claim 2 wherein:
said nobel metal is platinum.

4. A photodiode according to claim 1 wherein:
said coplanar surface of both said wafer and said pockets is anodized except for said small percentage of contact area.

5. A photodiode according to claim 1 wherein:
said layer of noble is 100 Å thick.

6. A photodiode according to claim 5 wherein:
said layers of chromium and gold have thicknesses of 100–200 Å and 2000–3000 Å respectively.

* * * * *